(12) United States Patent
Weber et al.

(10) Patent No.: US 7,473,130 B2
(45) Date of Patent: *Jan. 6, 2009

(54) SHIELDING CAGE

(75) Inventors: Ronald Christian Weber, Vught (NL); Gert Droesbeke, Geel (BE); Martinus Johannes Maria Peters, Zeeland (NL); Paulus Johannes Jozef Maria Pigmans, Tilburg (NL)

(73) Assignee: FCI, Versailles (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/560,560

(22) PCT Filed: May 14, 2004

(86) PCT No.: PCT/EP2004/050808

§ 371 (c)(1),
(2), (4) Date: Jun. 23, 2006

(87) PCT Pub. No.: WO2004/112199

PCT Pub. Date: Dec. 23, 2004

(65) Prior Publication Data

US 2007/0128934 A1 Jun. 7, 2007

(30) Foreign Application Priority Data

Jun. 13, 2003 (NL) .................................... 1023662

(51) Int. Cl.
*H01R 13/04* (2006.01)
(52) U.S. Cl. .................................................. 439/607
(58) Field of Classification Search ................. 439/607, 439/609

See application file for complete search history.

(56) References Cited

U.S. PATENT DOCUMENTS

| 5,037,331 | A | * | 8/1991 | Goodman et al. | 439/607 |
| 5,073,130 | A | | 12/1991 | Nakamura | 439/607 |
| 5,167,531 | A | | 12/1992 | Broschard, III et al. | 439/540 |
| 5,752,854 | A | * | 5/1998 | Capp et al. | 439/607 |
| 6,074,223 | A | | 6/2000 | Huang | 439/95 |
| 6,095,862 | A | | 8/2000 | Doye et al. | 439/607 |
| 6,398,587 | B1 | * | 6/2002 | Chen et al. | 439/607 |
| 6,478,622 | B1 | * | 11/2002 | Hwang | 439/607 |
| 6,517,382 | B2 | * | 2/2003 | Flickinger et al. | 439/607 |
| 6,752,663 | B2 | * | 6/2004 | Bright et al. | 439/607 |
| 6,858,322 | B2 | * | 2/2005 | Carey et al. | 428/648 |
| 7,074,082 | B2 | * | 7/2006 | Kerlin et al. | 439/607 |

FOREIGN PATENT DOCUMENTS

EP 1 026 785 A2 8/2000

\* cited by examiner

*Primary Examiner*—Neil Abrams
*Assistant Examiner*—Phuong Nguyen
(74) *Attorney, Agent, or Firm*—Harrington & Smith, PC

(57) ABSTRACT

The invention relates to a shielding cage extending along a longitudinal axis between a front side and a rear side and including a diecast metal section extending from said front side over a first length along said longitudinal axis. The shielding cage contains a sheet metal section extending from said rear side towards said front side over a second length along said longitudinal axis, said first length being substantially shorter than said second length. The shielding cage combines a considerable degree of freedom in shaping and robustness at the diecast front side with a substantial reduction of the temperature induced stresses as the length of the diecast section is substantially shorter than that of the second shield metal section of the cage.

20 Claims, 7 Drawing Sheets

SHIELDING CAGE

The invention relates to a shielding cage extending along a longitudinal axis between a front side and a rear side and comprising a diecast metal section extending from said front side over a first length along said longitudinal axis.

U.S. Pat. No. 5,167,531 discloses a right-angle electrical connector for mounting on a circuit board, wherein the connector comprises a diecast metal housing having projections connecting the housing to the circuit board. A metal shield is secured between the sidewalls of the diecast housing and forms a rear wall covering the terminals of the connector.

Diecast shielding cages are advantageous in that they provide a considerable degree of freedom in shaping as well as robustness. However, a problem associated with such diecast shielding cages is that the diecast material generally exhibits a thermal expansion coefficient that substantially differs from the thermal expansion coefficient of the circuit board. Depending on the way of mounting the shielding case to the circuit board, a shear stress or push/pull stress may develop between the cage and the circuit board as a result of heat applied in the mounting process. This problem is exacerbated by the need to conduct reflow operations at significantly higher temperatures to enable the use of lead free solders, which have a significantly higher melting point as compared with lead-based solders.

It is an object of the invention to provide a shielding cage that inter alia reduces or eliminates the above-mention problem.

This object is achieved by providing a shielding cage characterized by a sheet metal section extending from said rear side towards said front side over a second length along said longitudinal axis, said first length being substantially shorter than said second length. The shielding cage thus comprises two distinguishable sections. Each section contributes in providing the space of the entire shielding cage. The thus obtained shielding cage combines a considerable degree of freedom in shaping and robustness at the diecast front side of the cage with a substantial reduction of the stresses mentioned above as the length of the diecast part of the shielding cage is substantially shorter than the second shield metal section of the cage. The shield metal section of the cage provides a space with sufficient length along the longitudinal axis for accommodating a board connector and a mating cable connector. The long sheet metal section does not develop shear stress at the point of solder attachment to the circuit board as a result of the heat of the mounting process (and subsequent cooling of the assembly), since the difference in thermal expansion coefficient is minimal. The ratio of said first length and said second length is preferably in the range 1:3 to 1:6 and more preferably in the range of 1:4 to 1:5.

In an embodiment of the invention the diecast metal section of the shielding cage comprises mounting tails for mounting said diecast metal section to a circuit board. Preferably these mounting tails are solid integrated mounting tails of said diecast metal section, such as pin-in-paste (PIP) solder tails. As a cable connector generally is mated and locked at the front diecast metal section of the shielding cage, the mounting tails direct forces exerted on or by such a cable connector directly to the circuit board thereby preventing transmission of such forces to the board connector.

In an embodiment of the invention the sheet metal section comprises surface mounted technology (SMT)-tails for mounting said sheet metal section to a circuit board. Such tails are generally preferable from a manufacturing point of view as such SMT tails can be soldered on to the circuit board without requiring the provision of holes in the board. Alternatively the sheet metal section comprises surface mount compression (SMC) tails for mounting said sheet metal section to a circuit board comprising means for engaging, such as clamping springs, with said SMC tails. These tails may be preferable in a situation wherein a combination of a soldering paste and reflow mounting is disadvantageous or inefficient. This may e.g. be the case when the shielding cage itself inefficiently transfers the heat in the reflow mounting process. The use of SMC tails avoids the need for disposal of soldering paste and subsequent heating.

In an embodiment of the invention said diecast metal section and said sheet metal section comprise structures for engaging said diecast metal section with said sheet metal section. Such means may e.g. be deformable pillars provided on the diecast metal section that are easily deformed after engagement with corresponding openings in the sheet metal section. As such a closed and rigid connection to the shielding cage is obtained, a good electrical connection is ensured for electromagnetic shielding purposes.

In an embodiment of the invention the diecast metal section of the shielding cage comprises positioning elements for placing said sheet metal section with respect to said diecast metal section. Such position means, as e.g. ribs and/or slots, can be cast easily in the diecast material and facilitate positioning and/or alignment of the sheet metal section with the diecast metal section.

In an embodiment of the invention the shielding cage comprises a diecast metal section of a zinc alloy and a sheet metal section of a copper or steel alloy. A zinc alloy is a cheap diecast material. Preferably the zinc alloy diecast section is plated with layers of copper, nickel and/or tin, whereas the sheet metal section is plated with nickel and/or tin. In the reflow process the tin layer of the diecast metal section and the sheet metal section may contact, such that the electromagnetic shielding performance is improved.

The invention further relates to a diecast metal section and a sheet metal section for use in a shielding cage as described above.

The invention also relates to an electrical board connector comprising a header assembly and a shielding cage as described above.

U.S. Pat. No. 6,095,862 discloses a metal adapter frame assembly for mounting a first electrical connector in an aperture in a panel and a second electrical connector mountable on a printed circuit board that comprises a diecast metal body and stamped and formed sheet metal sheet mounted over a substantial section of the diecast metal body. The diecast metal body has an open top that is covered by the sheet metal shield. The assembly is mounted to the printed circuit board by one or more latch arms of the sheet metal shield extending beyond the diecast body. Since the diecast metal body is not mounted to the circuit board, this assembly does not suffer from the problem of developing stresses as a result of the difference in thermal expansion coefficient with the circuit board. Moreover the diecast metal body extends from the front side to the rear side of the assembly and thus only has one section. The sheet metal section does not provide an additional space for the shielding cage.

The invention will be further illustrated with reference to the attached drawings, which show a preferred embodiment of the invention. It will be understood that the shielding cage according to the invention is not in any way restricted to this specific and preferred embodiment.

Figure 1:
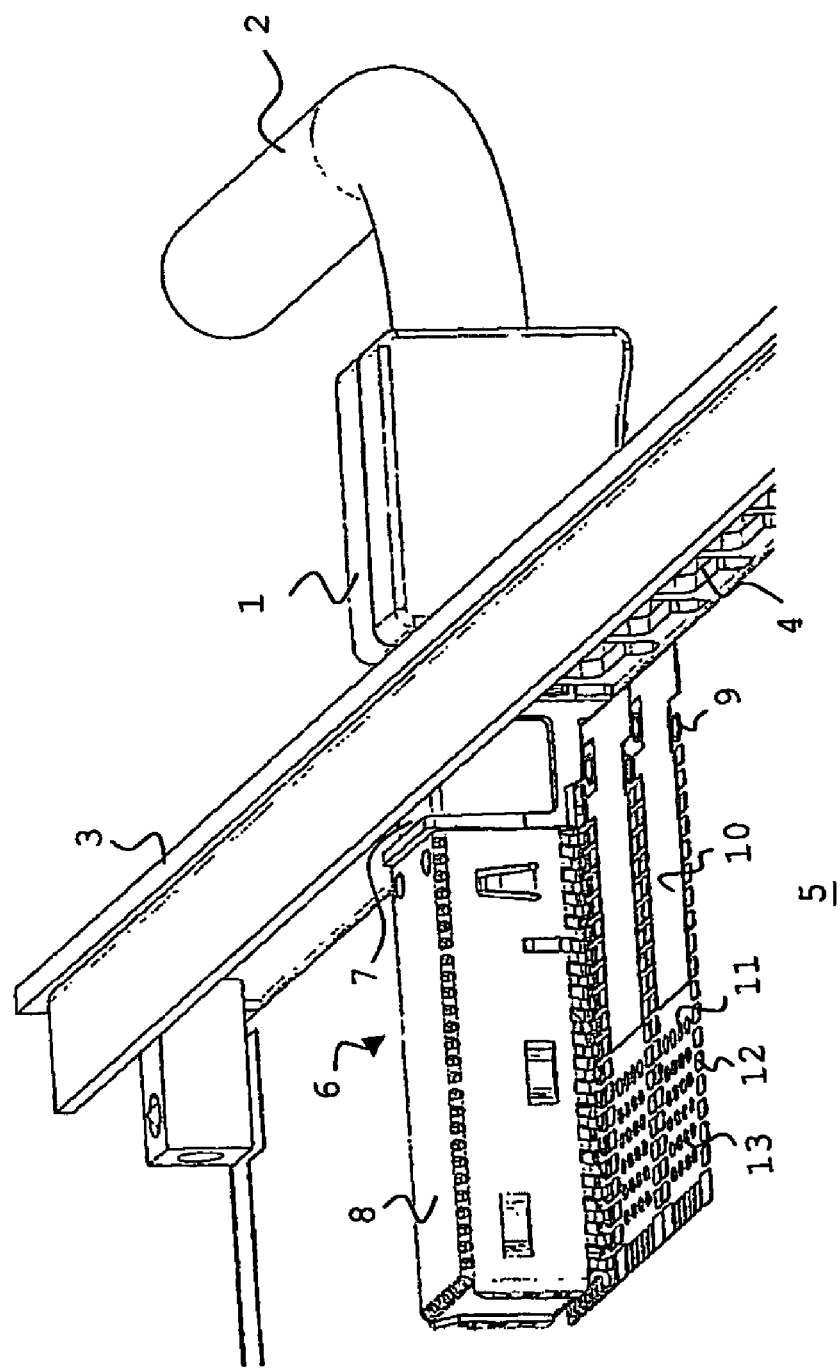
FIG. 1 shows a cable connector connected to a circuit board with a shielding cage according to an embodiment of the invention.

In FIG. 1 a connector system is shown comprising a cable connector 1 for a cable 2 attached to a front panel 3 having openings 4 for insertion of the cable connector 1. The cable connector 1 is subject of a non-prepublished patent application NL 1022225("Cable connector and method of assembling a cable to such a cable connector") of the applicant. The front panel 3 comprises a circuit board 5, hereinafter also referred to as the PCB 5. The PCB 5 generally comprises a plurality of signal tracks and electrical components (not shown) for the transmittal of electrical signals to or from one or more wires of the cable 2. Connections of these wires to the signal tracks of the PCB 5 are obtained by providing a header arrangement comprising a header (shown in FIG. 5). A shielding cage 6 is provided on the PCB 5, said shielding cage having a diecast metal section 7 at the front (i.e. near the panel 3) and a sheet metal section 8 backwards thereof. The PCB 5 further comprises various features, such as pin-in-paste (PIP) holes 9, a copper shielding plane 10, pre-alignment or guiding holes 11, soldering pads 12 and terminal PIP holes 13.

The shielding cage 6 may e.g. be mounted to the PCB 5 by soldering the respective tails of the diecast metal section 7 and the sheet metal section 8 in a lead-free reflow process, wherein the PCB 5 and the components are placed in a convection oven and heated to 265° C. from the top of the shielding cage 6.

Next detailed parts of the shielding cage 6 will be discussed. Identical reference numerals are used for indicating identical parts of the shielding cage.

Figure 2:
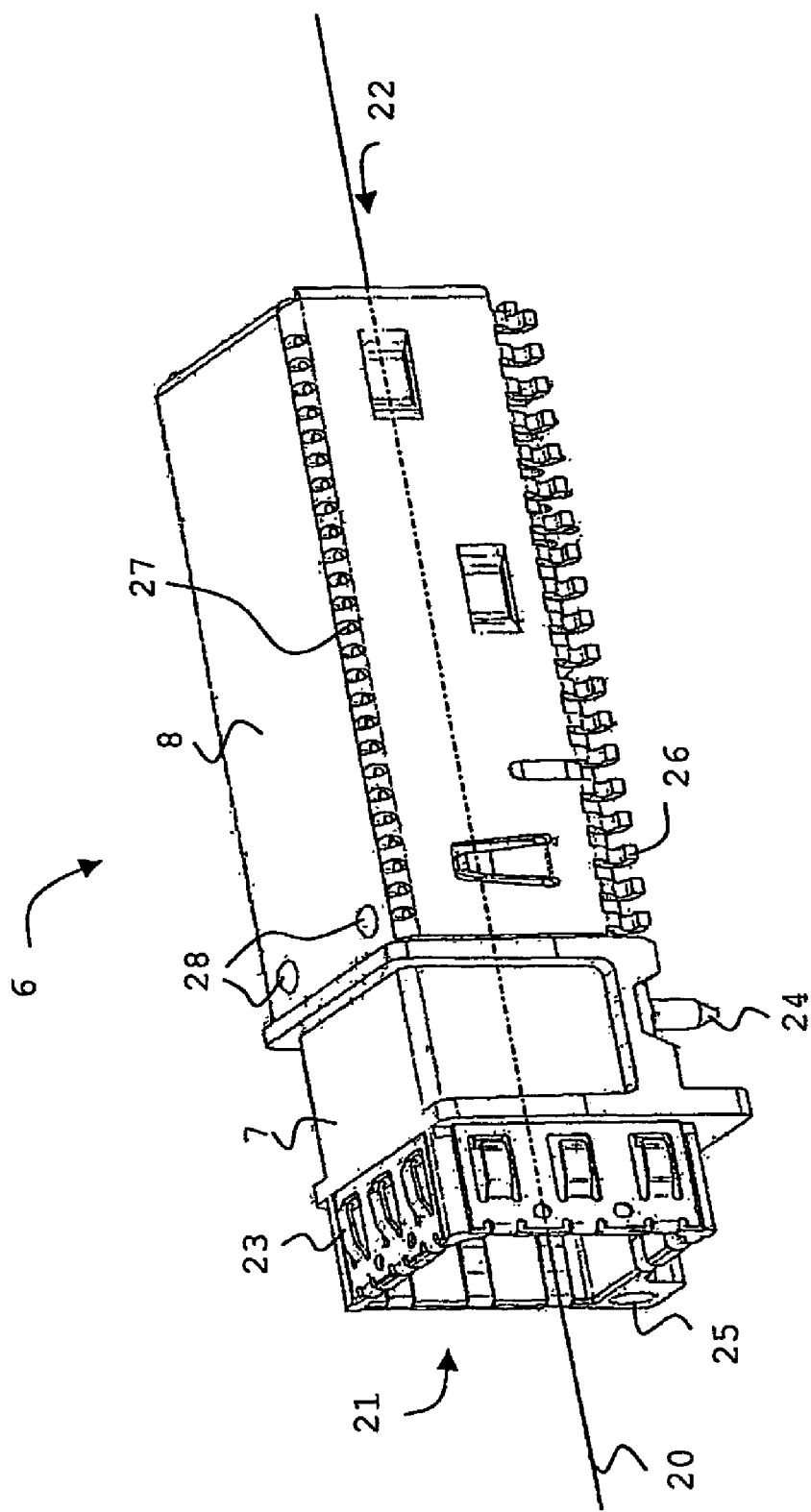
FIG. 2 shows a side perspective view of the shielding cage according to an embodiment of the invention.

FIG. 2 shows a side perspective view of the shielding cage 6 shown in FIG. 1 extending along a longitudinal axis 20 between a front side 21 and a rear side 22 comprising the diecast metal section 7 and the sheet metal section 8. The diecast front section 7 of the shielding cage 6 is especially important for I/O panels in view of the design complexity, design freedom and robustness of diecast metal. The diecast metal section 7 partly protrudes through the opening 4 of the panel 3 as shown in FIG. 1. The protruding section comprises metal springs 23 that either bend towards or away from the longitudinal axis 20 for contacting the cable connector 1 and the panel 3 respectively to obtain adequate electromagnetic shielding.

Further the diecast metal section 7 has PIP solder tails 24 to engage with the PIP holes 9 of the PCB 5, shown in FIG. 1. The PIP solder tails 24 direct forces exerted on or by the cable connector 1 directly to the PCB 5. The diecast metal section 7 also comprises an entrance 25 for locking the cable connector 1. The PIP solder tails 24 are not located in a single plane perpendicular to the longitudinal axis 20 in order to prevent that the shielding cage 6 can be lifted or angled away from the PCB 5 as e.g. the cable 2 is bend. Moreover these positions of the PIP solder tails 24 allow a closer placement of subsequent shielding cages 6 without interference of the PIP-holes 9 for the subsequent shielding cages 6.

The sheet metal section 8 comprises a plurality of surface mount technology (SMT) tails 26 adapted to be soldered to the soldering pads 12 on the PCB 5. As the thermal expansion coefficient of the sheet metal section 8 is largely comparable to that of the PCB 5 heat treatment does not result in cracks of the solder joint at the soldering pads 12 or warped/bend PCBs 5. The SMT-tails 26 are located close to each other to maintain adequate electromagnetic shielding.

Further the sheet metal section 8 contains a number of holes 27 for outgassing of constituents of the soldering paste, such as certain solvents, during the mounting process. Moreover, the holes 27 may assist in the transfer of convection heat to the inside of the shielding cage since preferably the shielding cage 6 and the header assembly 30 (shown in FIGS. 4 and 5) are mounted to the circuit board as a single piece.

The use of a sheet metal section 8 as part of the shielding cage 6 has several advantages. First the wall thickness of the sheet metal section 8 can be made less than the wall thickness of a diecast metal wall. As a result neighbouring PCB's 5 can be positioned more closely to each other. Further the shielding cage 6 with a sheet metal section absorbs less heat enabling more heat to be transferred to the board connector (see FIG. 5) in the reflow process. Also the shielding cage 6 according to the invention yields a higher accuracy with respect to positioning of the cage 6 on the PCB 5 due to the reduced mass inertia in vacuum assisted pick-and-placing. Finally the surface roughness of a sheet metal section 8 is usually less than for diecast metal resulting in a better grip of the vacuum nozzle in pick and placing of the shielding cage 6 on the PCB 5.

The diecast metal section 7 and the sheet metal section 8 are riveted by deforming pillars 28 of the diecast metal section 7 (more clearly shown in FIG. 6) after having these pillars 28 inserted in corresponding holes 60 (see FIG. 7) of the sheet metal section 8. The thus obtained shielding cage 6 is very rigid which is advantageous for handling, transport and placement on the PCB 5.

The sheet metal section 8 can be removed together with the header assembly 30 (shown in FIGS. 4 and 5) perpendicularly from the PCB 5, requiring no additional space for repair or removal of the connector. This results in additional space on the PCB 5 for accommodation of components.

The diecast metal section 7 is made of a zinc alloy. Preferably it is plated with a copper layer to prevent outward diffusion of the zinc in the heating process followed by layers of nickel and tin. The shield metal section 8 is made of a copper or steel alloy plated with layers of nickel and tin. In the heating process the tin layers of both sections may combine and fuse together to provide a continuous layer between both sections yielding an increased electromagnetic shielding performance.

Figure 3:
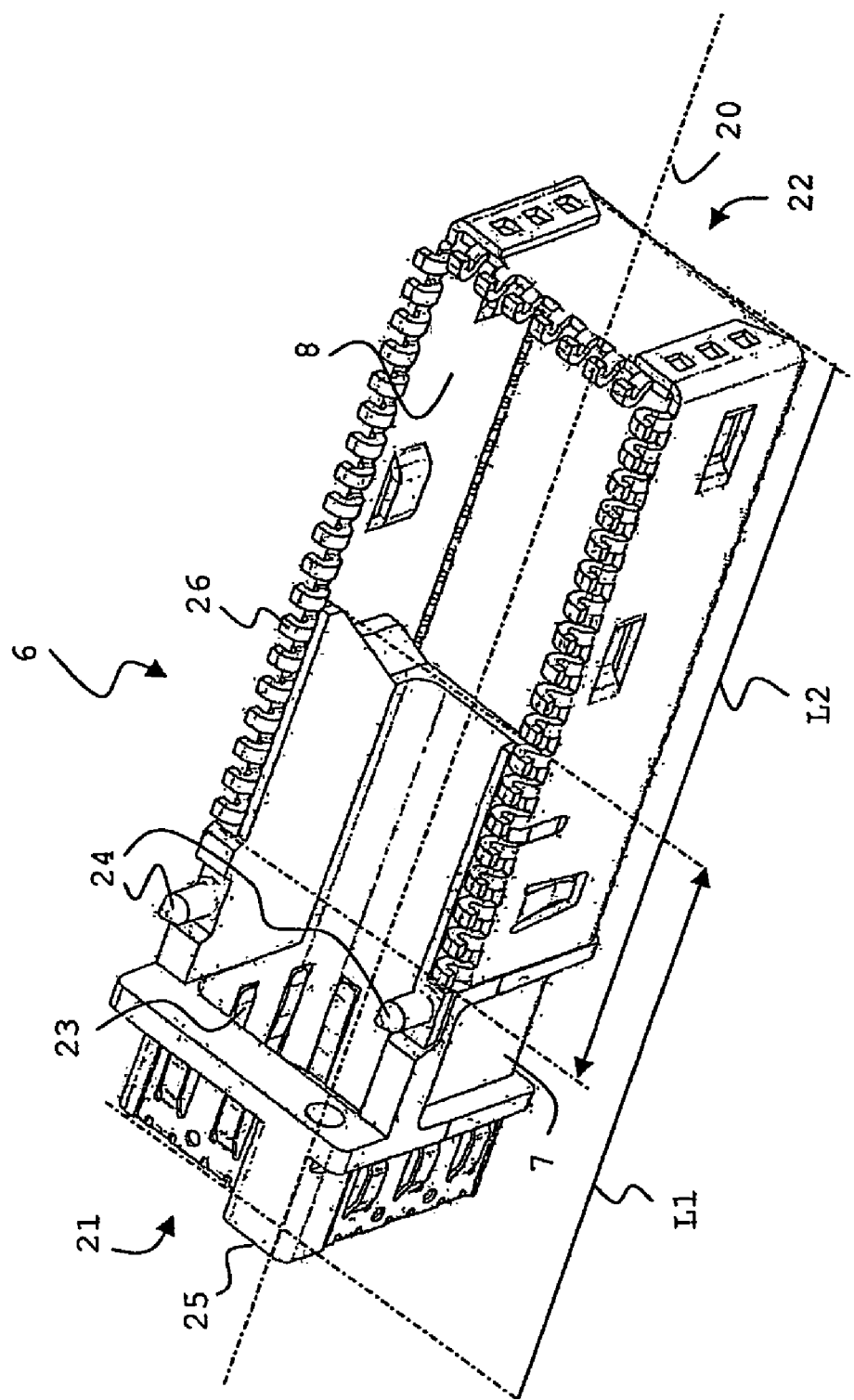
FIG. 3 shows a bottom perspective view of the shielding cage without a header assembly.
Figure 4:
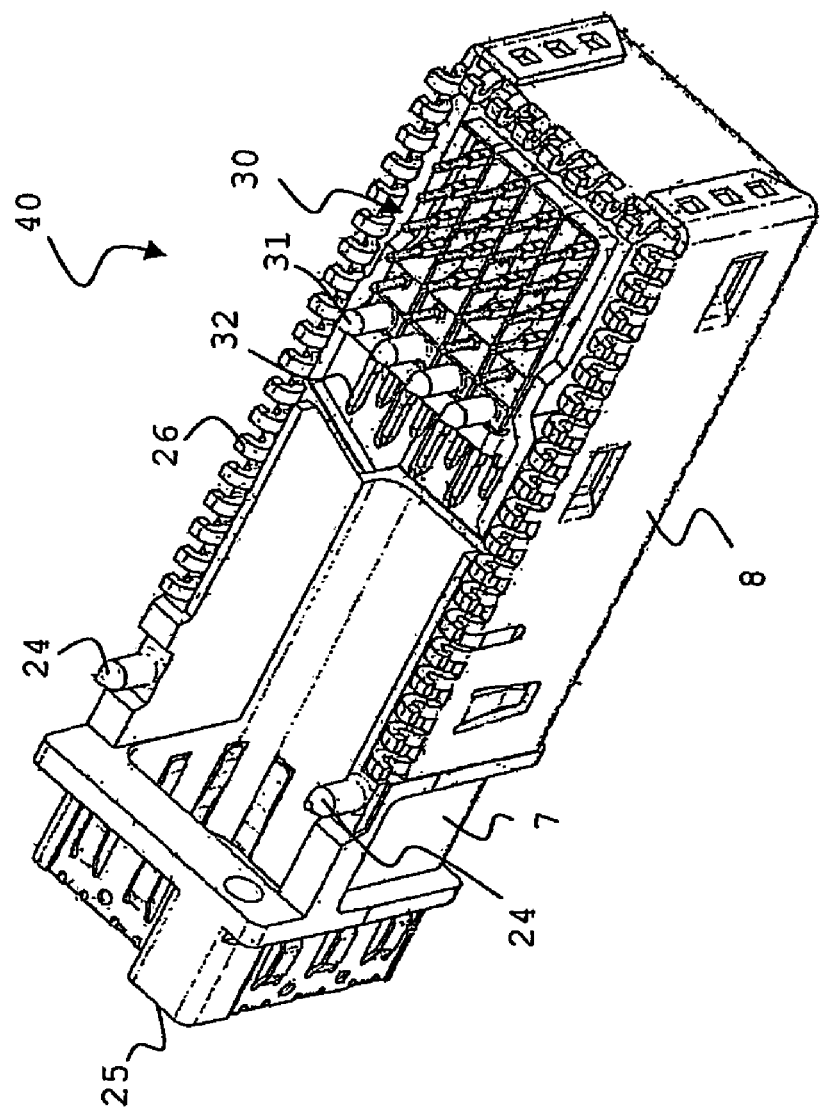
FIG. 4 shows a bottom perspective view of the shielding cage accommodating a header assembly.

FIG. 3 shows a bottom perspective view of the shielding cage 6 comprising the diecast metal section 7 extending over a first length L1 along the longitudinal axis 20 and the sheet metal section 8 over a second length L2 along the longitudinal axis 20. Although the walls of the diecast metal section 7 and the sheet metal section 8 partly overlap, both sections 7, 8 contribute to the space for the shielding cage 6. The sheet metal section 8 provides e.g. a space for a header assembly, as shown in FIG. 4. The length L1 of the diecast metal section 7 along the longitudinal axis 20 is substantially shorter than the length L2 of the sheet metal section 8 along the axis 20. In a practical situation the ratio of the lengths is e.g. L1:L2=1:3. In actual dimensions may e.g. be L1=10 mm and L2=30 mm. The sections 7, 8 are mounted differently to the PCB 5.

Figure 5:
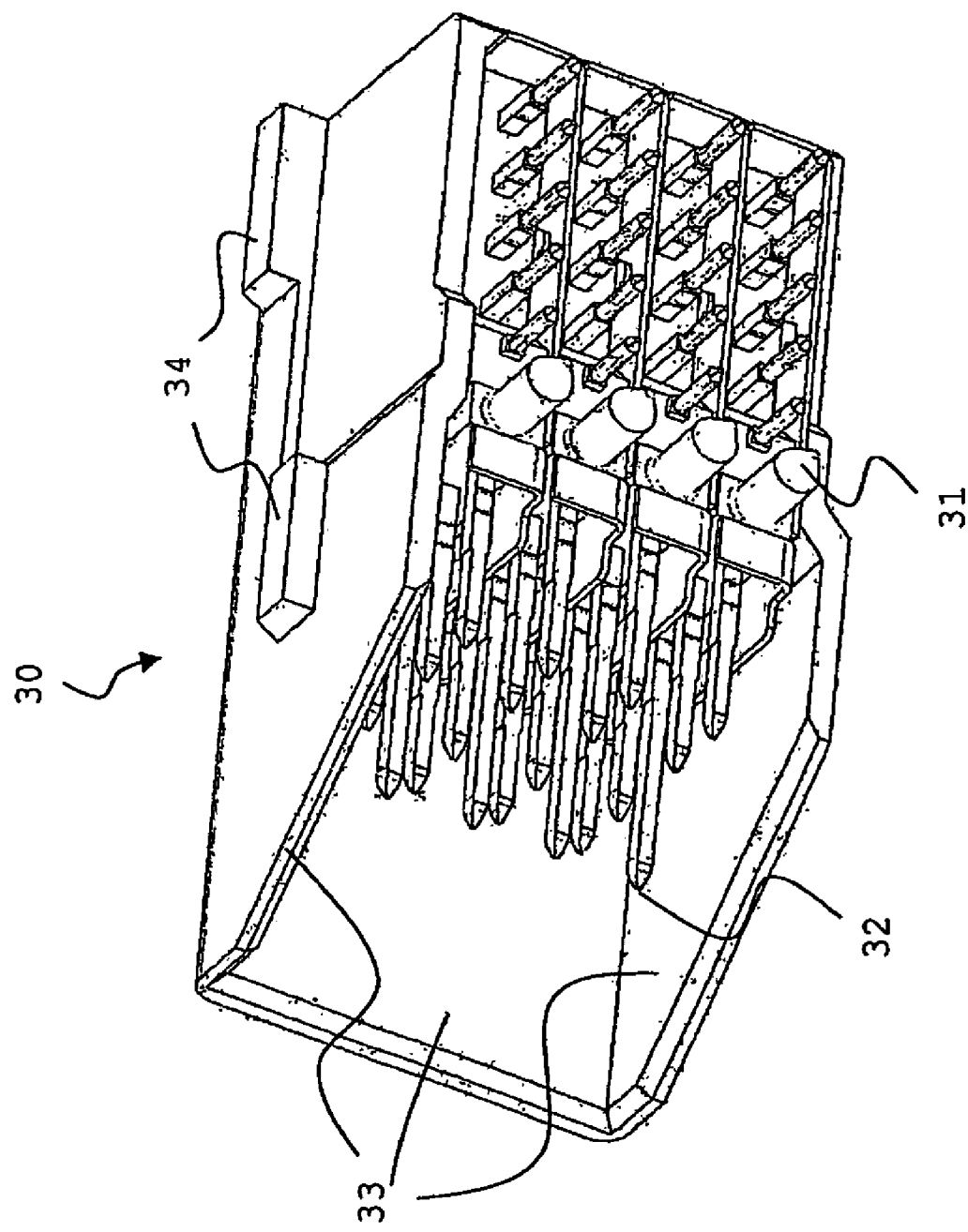
FIG. 5 shows an embodiment of a header assembly.

FIG. 4 displays a bottom perspective view of the shielding cage 6 accommodating a header assembly 30. This combination may be referred to as a board connector 40. The header assembly 30 comprises pre-alignment posts 31 for insertion in the guiding holes 11 and a contact array of terminal pins 32 for insertion in the terminal PIP holes 13 of the PCB 5 (see FIG. 1). The terminal pins 32 transfer signals from or to one or more of the wires of the cable 2 via the cable connector 1 to the signal tracks of the PCB 5. FIG. 5 shows a detailed illustration of the header assembly 30 containing walls 33 facilitating guiding of the cable connector 1 to the terminal pins 32. The walls 32 further comprise elements 34 to lock the header assembly 30 inside the sheet metal section 8.

Figure 6:
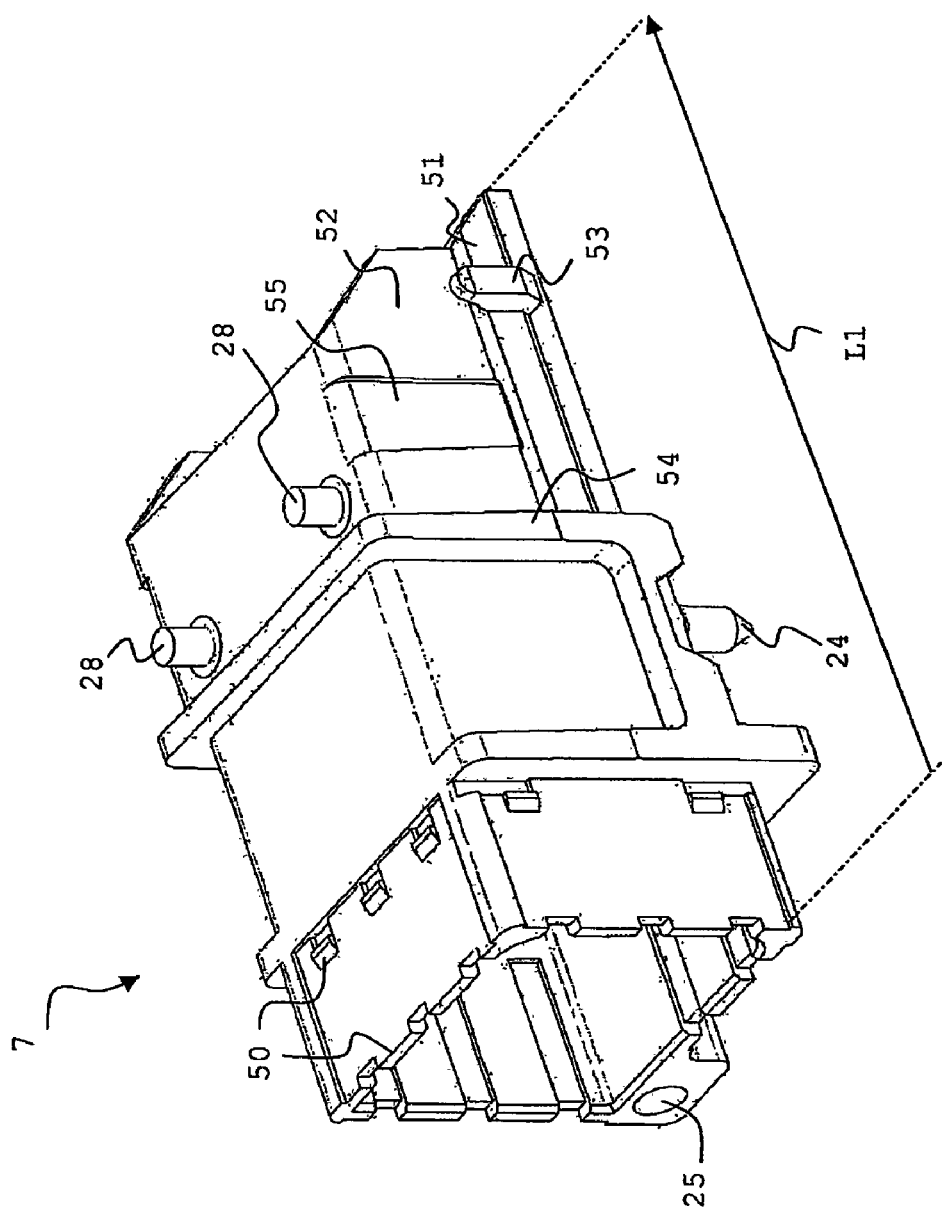
FIG. 6 shows a detailed view of the diecast metal section of the shielding cage according to an embodiment of the invention.

FIG. 6 shows a detailed view of the diecast metal section 7 of the shielding cage 6. The front part of the section 7, intended to protrude through the openings 4 of the panel 3, comprises means 50 for clipping on the metal springs 23, shown e.g. in FIG. 2. Moreover the diecast metal section 7 has a plurality of positioning means for placing or aligning the sheet metal section 8 with respect to the diecast metal section 7. These positioning means include a slot 51 (only one side visible), formed by the wall 52 and a rib 53 of the diecast metal section 7. The slots 51 are not in contact with the PCB 5 and are dimensioned to accommodate the SMT solder tails 26 of the sheet metal section 8. The slots 51 prevent rotational motion of the shielding cage 6 around an axis parallel to centre lines of the pillars 28.

The wall 52 further comprises a recess 55 to accommodate a flexible contact beam 62 (see FIG. 7) of the sheet metal section 8. Also diecast metal section 7 comprises cast protrusions or pillars 28 for riveting the sheet metal section 8 to the diecast metal section 7. The features enable the elimination of clearances between the diecast metal section 7 and the sheet metal section 8. Alternative methods can be used for combining the diecast metal section 7 and the sheet metal section 8, such as casting of the diecast metal section around the sheet metal section.

The flange 54 provides a barrier for electromagnetic radiation penetrating the shielding cage 6 through the openings between the contact springs 23 and the openings in the front panel 3.

Figure 7:
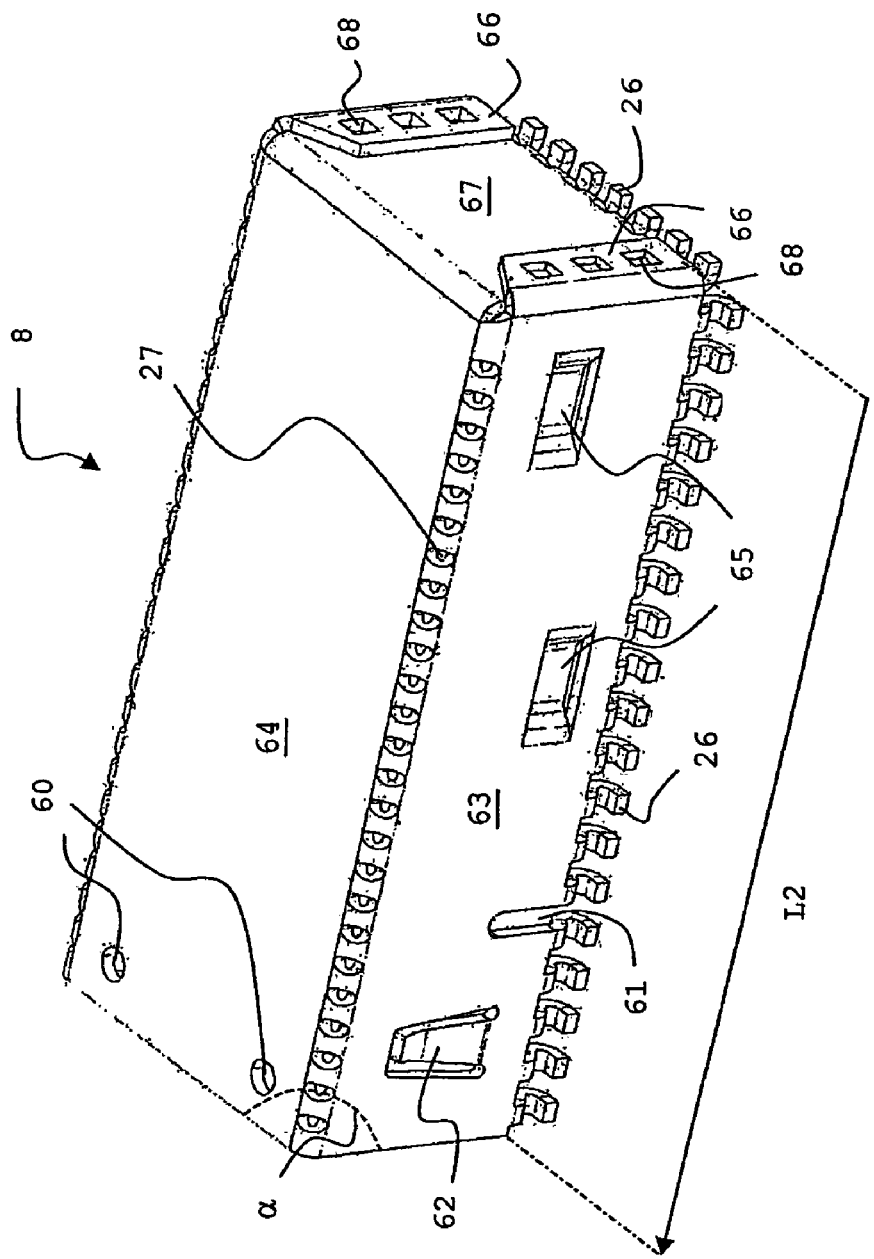
FIG. 7 shows a detailed view of the sheet metal section of the shielding cage according to an embodiment of the invention.

Finally FIG. 7 shows a detailed view of the sheet metal section 8. The holes 60 are intended for the deformable pillars 28 shown in FIG. 6. The slots 61 are intended for alignment of the sheet metal section 8 to the diecast section 7. The flexible contact beam 62 is intended to engage with the recess 55 in the wall 52 of the diecast metal section 7 in order to ensure adequate electrical contact for electromagnetic shielding purposes and/or to overcome mechanical tolerances between the section 7 and 8. As the flexible contact beams 62 (at least a second contact beam 62 may be provided at the opposite non-visible side of the sheet metal section 8) may yield a normal force driving the sheet metal section away from the diecast metal section 7, the side walls 63 of the sheet metal section 8 may build an angle α with the top wall 64 less than 90 degrees before it is positioned on the diecast metal section 7. Further the side walls 63 of the sheet metal section comprise indents 65 for interfering with the elements 34 of the header assembly 30 shown in FIG. 5 for locking said header assembly 30 inside the sheet metal section 8. The side walls 63 comprise wings 66 to cover the slit between the side walls 63 and the rear wall 67. The wings 66 comprise fastening elements 68 for fastening the wings 66 to the rear wall 67.

The invention is not limited to the above described embodiment as e.g. the SMT-tails 26 can be replaced with surface mount compression tails adapted to be engaged with springs on the PCB 5.

The invention claimed is:

1. Shielding cage extending along a longitudinal axis between a front side and a rear side and comprising a diecast metal section extending from said front side over a first length (L1) along said longitudinal axis characterized by a sheet metal section extending from said rear side towards said front side over a second length (L2) along said longitudinal axis, said first length being substantially shorter than said second length, wherein said diecast metal section comprises integrally formed mounting tails for mounting said diecaet metal section to a circuit board.

2. Shielding cage according to claim 1, wherein said mounting tails are solid mounting tails of said diecast metal section.

3. Shielding cage according to claim 1, wherein said mounting tails are Pin-in-Past (PIP) tails.

4. Shielding cage according to claim 1, wherein said sheet metal section comprises Surface Mounted Technology (SMT) tails for mounting said sheet metal section to a circuit board.

5. Shielding cage according to claim 1, wherein said sheet metal section comprises SMC tails for mounting said sheet metal section to a circuit board comprising means for engaging with said SMC tails.

6. Shielding cage according to claim 1, wherein said diecast metal section and said sheet metal section comprise structures for engaging said diecast metal section with said sheet metal section.

7. Shielding cage according to claim 1, wherein said diecast metal section comprises positioning elements for placing said sheet metal section with respect to said diecast metal section.

8. Shielding cage according to claim 1, wherein said diecast metal section is a diecast zinc alloy section and said sheet metal section is a sheet copper or steel alloy section.

9. Electrical board cornnector comprising a header assembly and a shielding cage according to claim 1.

10. Shielding cage according to claim 1, wherein the ratio of said first length to said second length is in the range 1:3 to 1;6.

11. Shielding cage according to claim 10, wherein said range is 1:4 to 1:5.

12. Shielding cage according to claim 1, wherein said diecast metal section and said sheet metal section comprise one or more outer layers capable of fusing on appliance of heat.

13. Shielding cage according to claim 12, wherein said diecast metal section is layered with layers of copper, nickel and/or tin and said sheet metal section is layered with layers of nickel and/or tin.

14. Shielding cage extending along a longitudinal axis between a front side and a rear side and comprising a diecast metal section extending from said front side over a first length (L1) along said longitudinal axis characterized by a sheet metal section extending from said rear side towards said front side over a second length (L2) along said longitudinal axis and wherein said diecast metal section comprises integrally formed mounting tails for mounting said diecast metal section to a circuit board.

15. Shielding cage according to claim 14, wherein said sheet metal section overlaps only a portion of said diecast metal section at a rear end of said diecast metal section.

16. Shielding cage according to claim 15, further comprising a metal spring member mounted on a front end of said diecast metal section.

17. Shielding cage according to claim 15, wherein said first length is shorter than said second length.

18. Shielding cage extending along a longitudinal axis between a front side of the shielding cage and a rear side of the shielding cage, the shielding cage comprising:

a diecast metal section extending from the front side over a first length along the longitudinal axis; and a sheet metal section directly connected to the diecast metal section, wherein the sheet metal section extends from the rear side towards the front side over a second length along the longitudinal axis, wherein the diecast metal section comprises an integrally formed mounting tail configured to mount the diecast metal section to a circuit board.

19. Shielding cage according to claim 18, wherein the sheet metal section overlaps only a portion of the diecast metal section at a rear end of the diecast metal section.

20. Shielding cage according to claim 19, wherein the first length is shorter than the second length.

* * * * *